(12) United States Patent
Rosik et al.

(10) Patent No.: US 7,415,261 B2
(45) Date of Patent: Aug. 19, 2008

(54) SYSTEMS AND METHOD FOR A HIGHLY LINEAR, LOW POWER MIXER

(75) Inventors: Ray Rosik, San Diego, CA (US); Mark Santini, San Diego, CA (US); Weinan Gao, San Diego, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 531 days.

(21) Appl. No.: 11/096,217

(22) Filed: Mar. 31, 2005

(65) Prior Publication Data

US 2006/0252401 A1     Nov. 9, 2006

(51) Int. Cl.
*H04B 1/26* (2006.01)
*H03K 17/00* (2006.01)

(52) U.S. Cl. ............... 455/313; 455/323; 455/333; 327/410; 327/404

(58) Field of Classification Search ............ 455/313, 455/323, 333; 327/403, 404, 410, 427
See application file for complete search history.

(56) References Cited

U.S. PATENT DOCUMENTS

| | | | | |
|---|---|---|---|---|
| 5,196,742 A | * | 3/1993 | McDonald | 327/65 |
| 6,118,341 A | * | 9/2000 | Huijsing et al. | 330/258 |
| 6,226,509 B1 | | 5/2001 | Mole et al. | |
| 6,631,257 B1 | | 10/2003 | White et al. | |
| 6,870,422 B2 | * | 3/2005 | Stockstad | 330/253 |
| 6,972,706 B2 | * | 12/2005 | Snoeijs | 341/158 |
| 7,016,664 B2 | * | 3/2006 | Souetinov | 455/323 |
| 2003/0017816 A1 | | 1/2003 | Souetinov | |
| 2006/0091944 A1 | * | 5/2006 | Kim et al. | 329/304 |

OTHER PUBLICATIONS

International Search Report dated Sep. 24, 2007 for PCT/US06/06719 filed on Feb. 27, 2006.

\* cited by examiner

*Primary Examiner*—Duc M Nguyen
(74) *Attorney, Agent, or Firm*—Baker & McKenzie LLP (57) ABSTRACT

A mixer for use in a transceiver comprises an LO switching pair and a folded transconductor. The mixer can be used as an upconversion or down conversion mixer and provides increased headroom and linearity, while still reducing current consumption. The mixer can be configured for differential inputs and outputs and the folded transconductor can comprises a MOSFET differential pair.

66 Claims, 8 Drawing Sheets

SYSTEMS AND METHOD FOR A HIGHLY LINEAR, LOW POWER MIXER

BACKGROUND

1. Field of the Invention

The invention described herein relate generally to transceiver design and more specifically to the design of mixers for use in a plurality of transceivers.

2. Background

Figure 1:
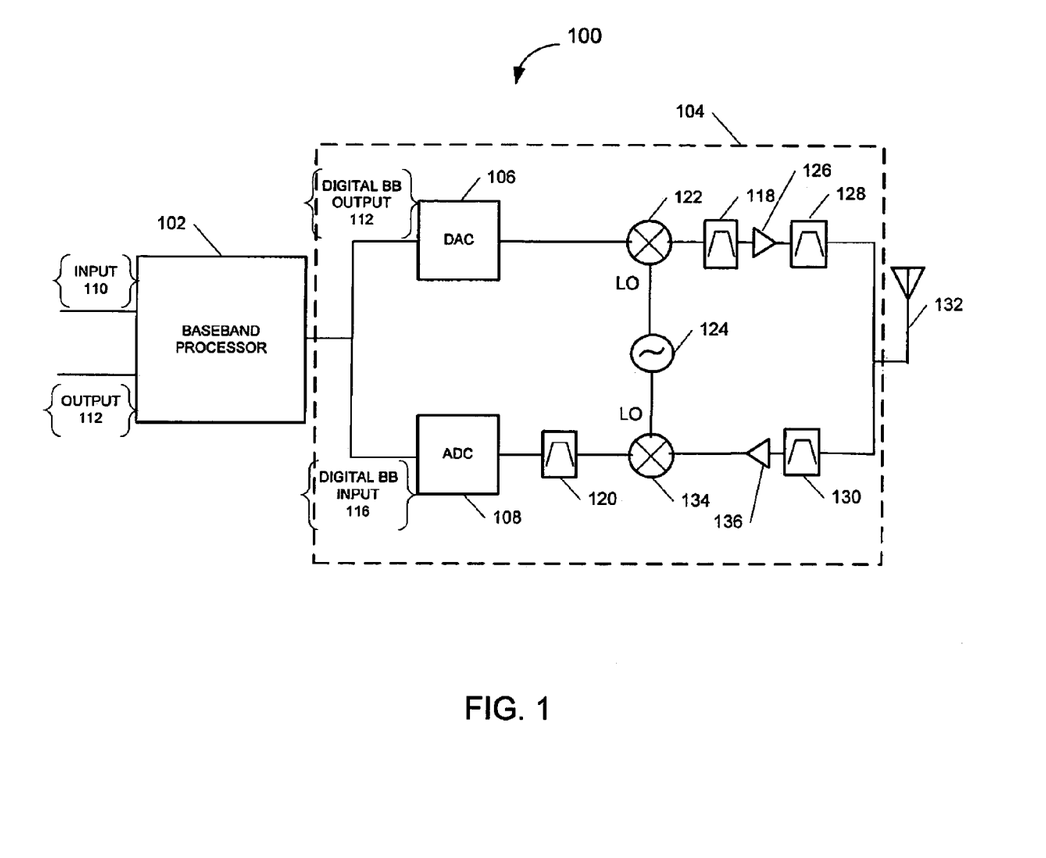
FIG. 1 is a diagram illustrating a example communication device.

FIG. 1 illustrates an example device 100 that includes a transceiver 104 interfaced with a baseband processing circuit 102. The upper portion of transceiver 104 is the transmit portion and the lower portion of transceiver 104 is the receive portion. Transceiver 104 is configured to transmit and receive RF signals via antenna 132 using the transmit and receive portions of transceiver 104, respectively. The other end of transceiver 104 is interfaced with baseband processor 102.

For the transmit function, baseband processor 102 receives an input signal 110 and converts it into a digital baseband output signal 112. Baseband processor 102 then passes digital baseband output signal 112 to a Digital-to-Analog Converter (DAC), which is configured to convert output signal 112 into an analog baseband signal that can be upconverted, using upconversion mixer 122, to a RF signal capable of being transmitted via antenna 132. For example, baseband processor 102 can be configured to convert input signal 110 in accordance with the protocols and standards that govern the system in which device 100 is operating and the air interface being used.

A filter, such as filter 118 can be included to filter out unwanted noise and signals from the RF signal after conversion by mixer 122. In addition, a Power Amplifier (PA) 126 is typically included in the transmit portion of many transceivers. PA 126 is used to amplify the RF signal to a level that is sufficient to allow the signal to be transmitted over large distances. A second, bandpass filter 128 can also be included between PA 126 and antenna 132.

The term "baseband signal" is intended to refer to an information bearing signal that resides at DC, or Ø, in the frequency spectrum. In other words, a baseband signal can be said to comprise two components: an information, or data component; and a frequency component, where the frequency component is actually centered at Ø hertz (Hz). Thus, upconversion mixer 122 translates the frequency component of the input baseband signal from Ø Hz to a target, RF frequency, e.g., 900 MHz. But the data component is ideally unaffected by the translation.

The RF signal that results from the upconversion process performed by upconversion mixer 122 is often referred to as the carrier signal, and the RF frequency of the RF signal is often referred to as the carrier frequency, because the data is literally being carried by the RF signal to the destination when the RF signal is transmitted via antenna 132.

On the receive side, an RF signal is received by the receive portion of transceiver 104 via antenna 132. The received RF signal passes through a bandpass filter 130 and is then amplified by Low Noise Amplifier (LNA) 136. LNA 136 is configured to amplify the typically very low level received signal to a level that is sufficient for further handling, while adding very little noise to the amplified signal. The amplified signal is then converted via down conversion mixer 134 from an RF signal to an analog baseband signal. The analog baseband signal can be filtered using filter 128 and converted to a digital baseband input signal 116. Baseband input signal 116 is then converted to a digital baseband input signal 116 by Analog-to-Digital Converter (ADC) 108. The resulting digital baseband input signal 116 is then passed to baseband processor 102 so that it can process the data included in the baseband signal. Baseband processor 102 can be configured to then generate an output signal 112, such as a voice output signal, from the processed data.

Transceiver 104 is an example of a direct conversion transceiver because it converts the received RF signals directly to a baseband signal using mixer 134. Similarly, transceiver 104 is configured to convert baseband transmit signals directly to an RF signal using mixer 122. But it will understood that alternative transceiver architectures, e.g., Intermediate Frequency (IF) architectures, are also used in communication applications. All of these architectures have in common the need to translate signals from one frequency to another.

Mixers are well known circuits used to translate signals between different frequency bands. Frequency translation is implemented by multiplying the signal with a Local Oscillator (LO) signal, thereby translating the signal up or down to the new desired signal band. This type of translation is often referred to as modulation. For example, in transceiver 104 up conversion mixer 122 converts the baseband signal to an RF signal by modulating the baseband signal with an LO signal, which is generated, e.g., by a Voltage Controlled Oscillator (VCO) circuit 124. Mixer 122 combines the baseband and LO signals in accordance with the following equations:

$$V_{RFOUT} = A\cos(2*\pi*f_0)*B\cos(2*\pi*f_{LO}) \qquad (1)$$
$$= (1/2)*A*B\cos[2*\pi*(f_0 \pm f_{LO})]$$
$$f_{RF} = f_0 \pm f_{LO}.$$

Where: $f_0$=the baseband center frequency;
$f_{LO}$=the LO center frequency; and
$f_{RF}$=the target RF center frequency.

In other words, a mixer, e.g., mixer 122, combines the two input signals, i.e., the baseband signal and the LO signal, and produces two possible output signals: one characterized by the frequency ($f_0+f_{LO}$); and one characterized by the frequency ($f_0-f_{LO}$). The signal with the desired output is then selected, while the undesired signal is filtered out. For mixer 122, the signal characterized by the frequency ($f_0+f_{LO}$) is selected while the signal characterized by the frequency ($f_0-f_{LO}$) is filtered out, e.g., using filter 118. Thus, the output of mixer 122 is a signal characterized by the following frequency:

$$f_{RF}=(f_0+f_{LO}) \qquad (2).$$

In this case, $f_0$=Ø, because the signal is a baseband signal, which is defined as a DC or Ø frequency signal. Thus, $f_{LO}=f_{RF}$.

Conversely, the output of mixer 134 is a signal characterized by the following frequency:

$$f_0=(f_{RF}-f_{LO}) \qquad (3)$$

Broadband transceivers for many applications including, e.g., wireless communication applications, such as Wireless Local Area Networking (WLAN) applications, digital satellite applications, and cable TV applications, to name a few, all require an upconversion mixer on the transmit side to translate the frequency component of a baseband signal up to a carrier frequency in the Radio Frequency (RF) range, as well as a down conversion mixer 134 configured to translate received RF signals to baseband signals.

The design constraints are different for upconversion versus down conversion mixers, because the design constraints for the corresponding transmitters and receivers are different.

For example, receivers must amplify signals spanning a wide dynamic range spanning several orders of magnitude of input signal power with low noise and minimum distortion. As a result, the noise figure and linearity must be optimized simultaneously to maximize the overall dynamic range. Conversely, the signal levels in a transmitter are typically large in amplitude. As a result, the design strategy on the transmit side is often focused on highest linearity performance together with lowest power consumption for longest battery life. Thus, the design of the upconversion and down conversion mixers, should take these design constraints into consideration as well.

Figure 2:
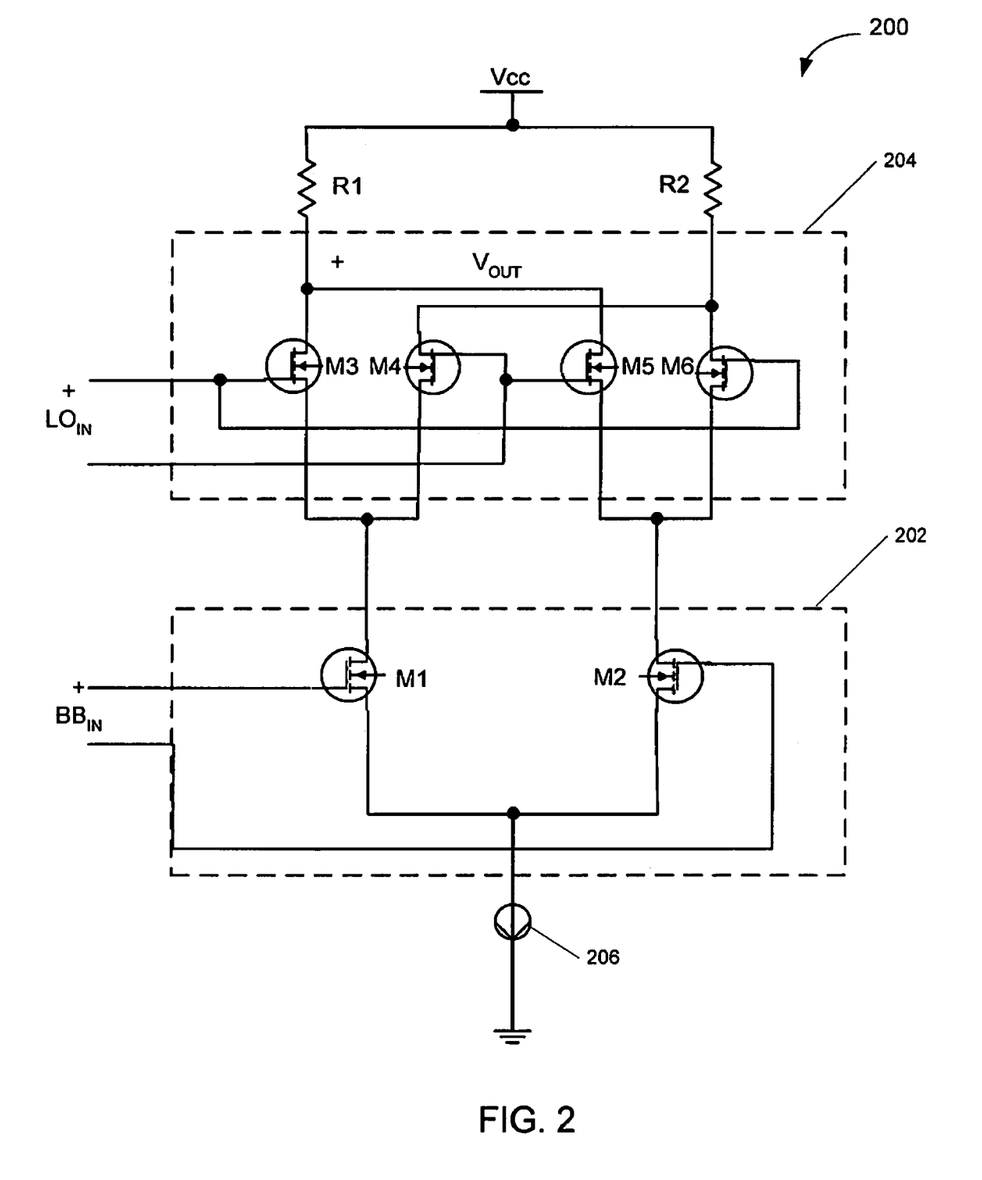
FIG. 2 is a schematic illustrating a conventional mixer design that can be used for a mixer included in the device of FIG. 1.

Conventional mixers are often Gilbert Cell mixers. FIG. 2 illustrates a common Gilbert Cell topology that uses CMOS technology. The Gilbert Cell mixer 200 of FIG. 2 can be seen to comprise a transconductor 202 and a oscillator switching pair 204. Transconductor 202 comprises CMOS transistors M1 and M2. Oscillator switching pair 204 comprises CMOS transistors M3-M6. A bias current generator 206 is also included for biasing transconductor transistors M1 and M2. In mixer 200 all transistors M1-M6 are NFET devices.

For upconversion applications, the input transconductor converts a differential, baseband voltage signal ($BB_{IN}$) into a baseband output signal current that is supplied to LO switching pair 204. Switching pair 204 is driven by a differential LO signal ($LO_{IN}$) to modulate the baseband signal current. This modulated current is then converted to a voltage with the load resistors R1 and R2. The voltage output ($V_{OUT}$) then comprises the baseband data signal ($BB_{IN}$) translated up to the RF carrier frequency by the LO signal ($LO_{IN}$).

Differential signals are used for their inherent rejection of common mode noise and for improved port to port isolation. For example, often a portion of the LO signal ($LO_{IN}$) will "leak" into the $BB_{IN}$ input port. This LO leakage then mixes with itself, producing a DC offset on the output of the mixer. In a direct conversion receiver, for example, the DC offset produced by this self-mixing process can saturate the remaining stages of the receiver. Therefore, it is critical to minimize this LO to BB leakage using differential topologies.

For transmitters, the ability to eliminate unwanted noise and improve port to port isolation can be important, because, e.g., they often fall outside of the intended frequency spectrum, or channel, and into adjacent channels. The unwanted noise or leakage then interfere with devices operating on those adjacent channels. Such interference is referred to as adjacent channel interference, and how well a system or device handles such potential interference is referred to as the device's adjacent channel performance. A device's adjacent channel performance is often measured in terms of the adjacent channel power ratio (ACPR). The better a device's ACPR, the better the device's adjacent channel performance. Often, a device will be required to meet a certain minimum ACPR in order to comply with the operational requirements of a specific system.

A mixer can impact a device's adjacent channel performance if it is not designed well. Several criteria should be considered when designing a mixer in order to ensure good adjacent channel performance. These requirements include low LO signal leakage, good linearity, and low power consumption. Often, meeting the requirements for good adjacent channel performance requires a trade off among one or more of these criteria. The importance of low LO signal leakage was addressed above. Good linearity is important for adjacent channel performance because modulated signals passing through any weakly non-linear circuit broaden the bandwidth of the transmitted signal spectrum. This increased bandwidth, also called spectral re-growth, results in adjacent channel interference, because it encroaches on the bandwidth associated with the adjacent channels.

Low power is important because devices, such as device 100 are often powered by batteries, making power conservation imperative to sustain longer battery lifetimes. Moreover, applications that use double-balance mixers in highly integrated transceivers place additional emphasis on low power consumption. This is because the mixer often shares the same substrate with many other power-hungry RF blocks within the transceiver including power amplifiers, low noise amplifiers, variable gain amplifiers, and voltage controlled oscillators. Integrating all of these blocks on one die in the same package leads to a very stringent power budget.

With regard to LO leakage, the double-balanced Gilbert cell mixer of FIG. 2 is a fundamental topology that minimizes LO signal leakage, when the layout is optimized to ensure that the best possible matching is achieved. With regard to linearity, many topology variations of the standard double-balanced mixer exist. Often, the differences in these topologies are related to techniques for improving, or optimizing the linearity of the input transconductor.

For example, a widely used approach to achieve greater linearity is series feedback using emitter degeneration with respect the transconductor transistors M1 and M2. The degeneration can be in the form of a resistance or an inductance placed in series with the emitters, or in the CMOS case the sources, of transistors M1 and M2, although inductance is often only helpful for frequencies up to about 200 MHz. Emitter degeneration techniques offer good linearity and high 3rd order Intercept Point (IP3); however, such techniques also suffer several drawbacks including higher current, which results in higher power consumption, higher noise figure, and headroom problems at lower supply voltages. Also, degeneration is much more effective in technologies that use NPN devices as opposed to CMOS devices.

Another approach to the linearization problem in mixers is the multi-tanh technique. The advantage of the multi-tanh transconductor is higher linearity with smaller degradation in noise figure; however, the shortcomings of such designs include, higher current, similar to emitter degeneration, and a limited input linear range dependant upon the number of multi-tanh stages used. The extra current is necessary because two tail currents are needed to implement the piecewise linear transconductor.

Still another approach suggests using multiple gated MOSFETs by linear superposing several common source devices in parallel to improve linearity in mixers and low noise amplifiers (LNA). The main drawback to such techniques is that the DC biasing, critical for successful linearization, is complicated to achieve. Also, such techniques are specialized for down conversion in receivers and will not necessarily work for broadband, upconversion mixers.

Accordingly, conventional mixer designs present tradeoffs with respect to low power and high linearity requirements, and do not allow for optimization of both in the same design. As a result, there are many topologies for transconductors and mixers that achieve high linearity at the expense of increased power dissipation, or visa versa, but none that achieve optimal performance in all areas, namely low LO leakage, high linearity, and low power consumption.

SUMMARY

A mixer for use in a transceiver comprises an LO switching pair and a folded transconductor. The mixer can be used as an upconversion or down conversion mixer and provides increased headroom and linearity, while still reducing current consumption.

In one aspect, the folded transconductor can comprises a MOSFET differential pair. Other aspects of the embodiments of the invention are further described in Exhibit A, appended to this application and incorporated herein by reference.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

The systems and method described below relate to mixer designs that provide inter alia low power and high linearity as well as low LO leakage. While certain embodiments are described below, this should not be seen as limiting the systems and methods described herein to any particular embodiment, or implementation as it will be apparent that many variations are possible.

Figure 3:
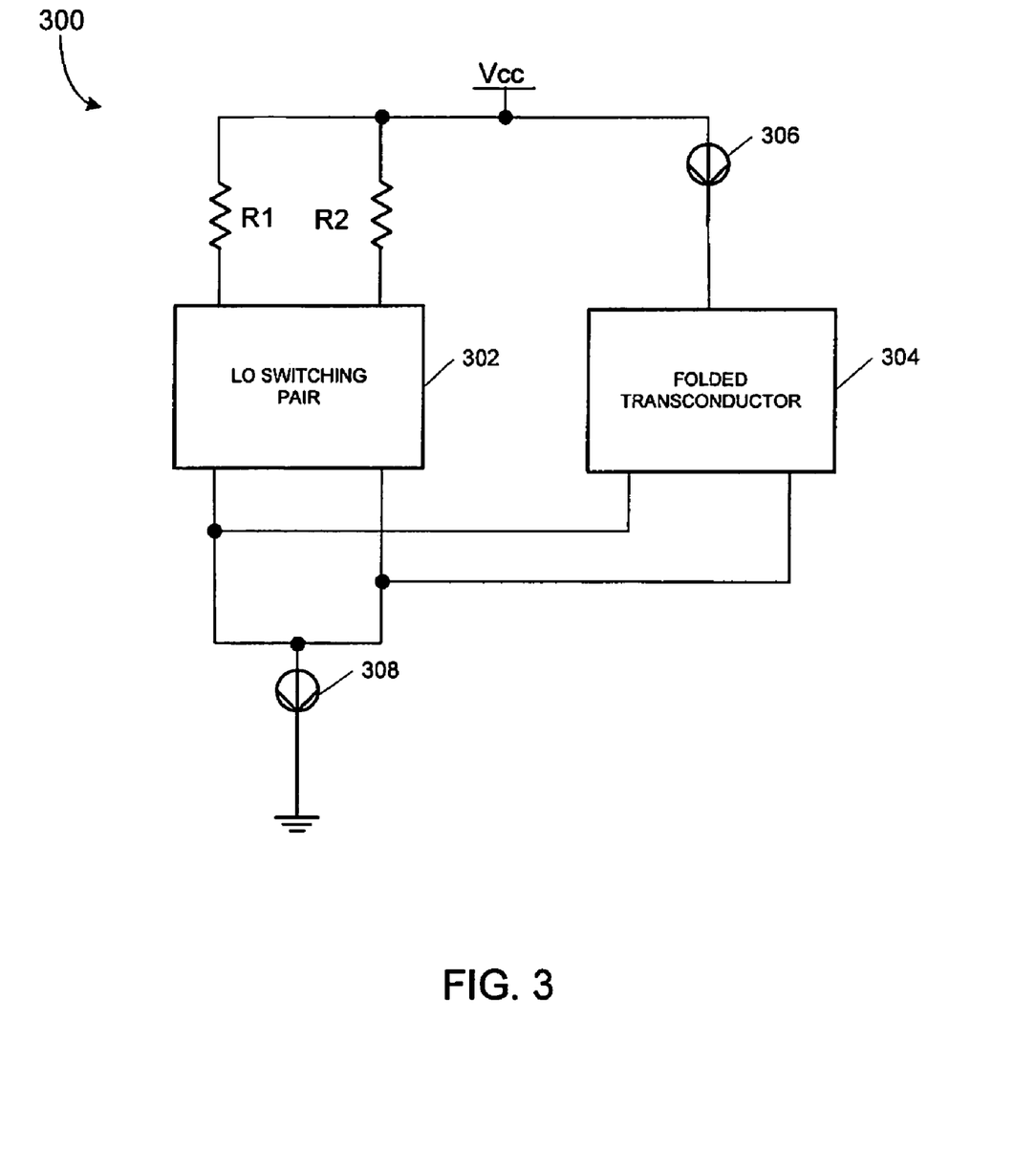
FIG. 3 is a diagram illustrating an example mixer comprising a folded transconductor that can be used in the device of FIG. 1 and that is configured in accordance with one embodiment.

The systems and methods described herein take advantage of what is termed "folding techniques," which can relax headroom constraints, and enable the use of a MOSFET differential pair for the input transconductor that uses very low bias current and is highly linear. FIG. 3 is a diagram illustrating a mixer 300 configured in accordance with one embodiment of the system and methods described herein. As can be seen, mixer 300 comprises a LO switching pair 302 and a folded transconductor 304 as well as current sources 306 and 308. The basic idea of the folded transconductor of FIG. 3 is to take the basic cascode gain stage and replace the input device with a device complementary to the cascode device. The complementary input device is then fed with a bias current from the opposite supply rail.

Figure 4A:
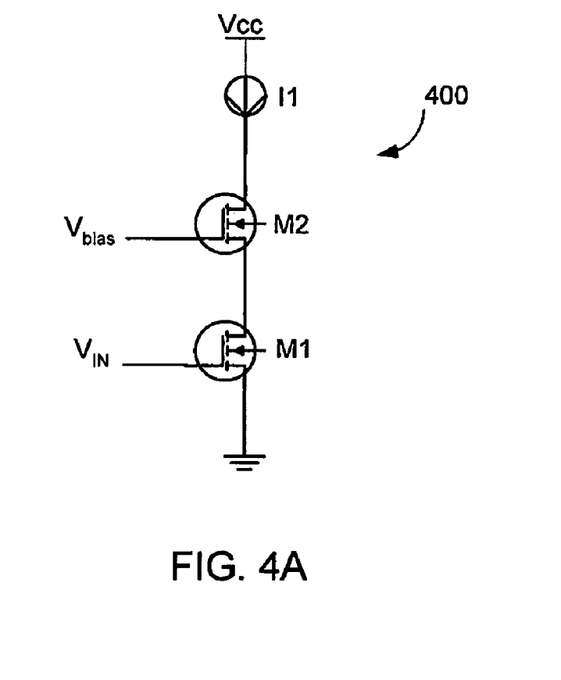
FIG. 4A is a diagram illustrating an example gain stage that uses a stacked configuration.

For example, FIG. 4A illustrates a cascode gain stage 400 with an NFET input transistor M1 and a cascode transistor M2 biased by a current source I1. Gain stage 400 can be said to be a stacked configuration, because the various stages, i.e., input transconductor devices M1 and M2, and current source I1 are stacked on top of each other. Similarly, mixer 200 is also in a stacked configuration. The stacked configuration has several inherent performance advantages including higher gain, higher output impedance, and potential applications requiring variable gain and/or mixers.

For example, a gain stage, such as each cascode gain stage 400, requires sufficient supply voltage for proper DC biasing. The input transconductor M1, the cascode device M2, and the current source all must be biased in the saturation region in order to effectively provide gain from the input to the output. For MOSFET devices, operation in the saturation region requires a drain to source voltage greater than the overdrive voltage. Typically, this voltage is in the range of 500 to 800 mV, depending upon the bias current, the aspect ratio (W/L), and the process technology. Therefore, stacking several saturated devices within any gain stages, as in FIG. 4A, requires sufficient voltage headroom within the supply voltage for a given process for proper DC biasing.

For the cascode gain stage example in 400, these headroom constraints limit the application of this topology to a minimum supply voltage of approximately 2.4 volts. Therefore, the process technologies for which this circuit can be used are also limited to minimum feature sizes of 0.18 μm or larger, because these processes use supply voltages that are larger than 1.8 volts, i.e., include supply voltages of 2.4 volts or higher. Similar headroom limitations also apply the same cascode gain stage implemented with BJT devices. BJT device biasing in the active region typically requires 500-800 mV of voltage from the collector to emitter. This voltage does not scale with process technology for the BJT. Therefore, the cascode stage is limited to supply voltages greater than a minimum of 2.4V or higher.

Figure 4B:
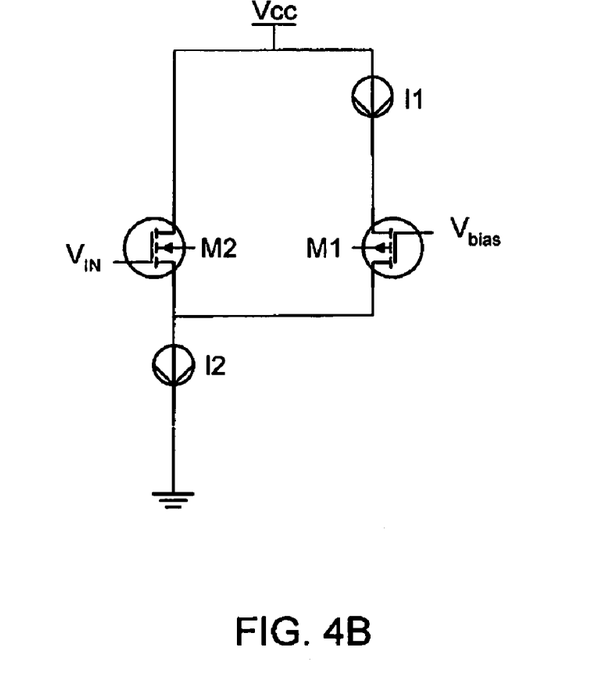
FIG. 4B is a diagram illustrating how the gain stage of FIG. 4A can be converted into a folded configuration.

The cascode gain stage of FIG. 4A can, however, be replaced with a folded gain stage 402 as shown in FIG. 4B. In FIG. 4B, input transistor M1 is now a PFET and is in parallel with, as opposed to being stacked under, device M2. Accordingly, the headroom requirement is reduced, because one stage is effectively removed from the headroom calculation. Current source I2 is added to force the sum of the current from input transconductor M1 and cascode device M2 to a constant value. In this way, extra signal current generated by input transconductor M1 is steered back up through cascode device M2 in order to maintain the constant value of the current in I2.

The gain stages of FIGS. 4A and 4B illustrate application of folding techniques that can achieve the advantages described above. The topology illustrated in FIG. 3 is an example of applying the same folding techniques to a mixer cell in accordance with the systems and methods described herein. In the topology illustrated in FIG. 3, transconductor 304 analogous to input device M1 and LO switching device 302 is analogous to the cascode device M2 in the folded cascode op amp illustrated in FIG. 4B.

In addition to the advantages described above, folded transconductor 304 also enables the use of a MOSFET differential pair. Use of a differential MOSFET pair can be preferable because the linearity of a MOSFET differential pair can be increased at very low bias current by reducing the device aspect ratio. The device aspect ratio refers to the ratio of the Width of the device to the Length of the device (W/L). The ratio of bias current over this aspect ratio sets the overdrive voltage of a FET device. Larger overdrive voltages result in improved linearity by creating a wider range of input voltage swings where both FETs, of the differential MOSFET pair, remain in saturation. This property of FETs presents the opportunity to use the MOSFET as a highly linear transconductor at very low bias current.

Figure 5A:
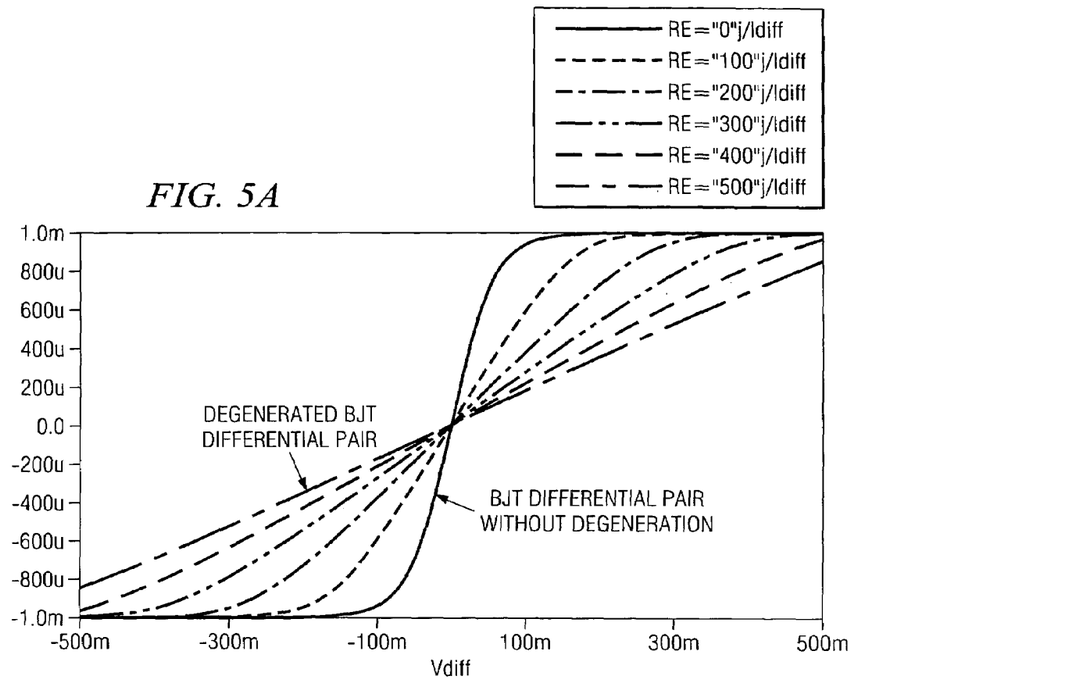
FIG. 5A is a diagram illustrating the current versus input voltage for a BJT differential pair with and without degeneration.
Figure 5B:
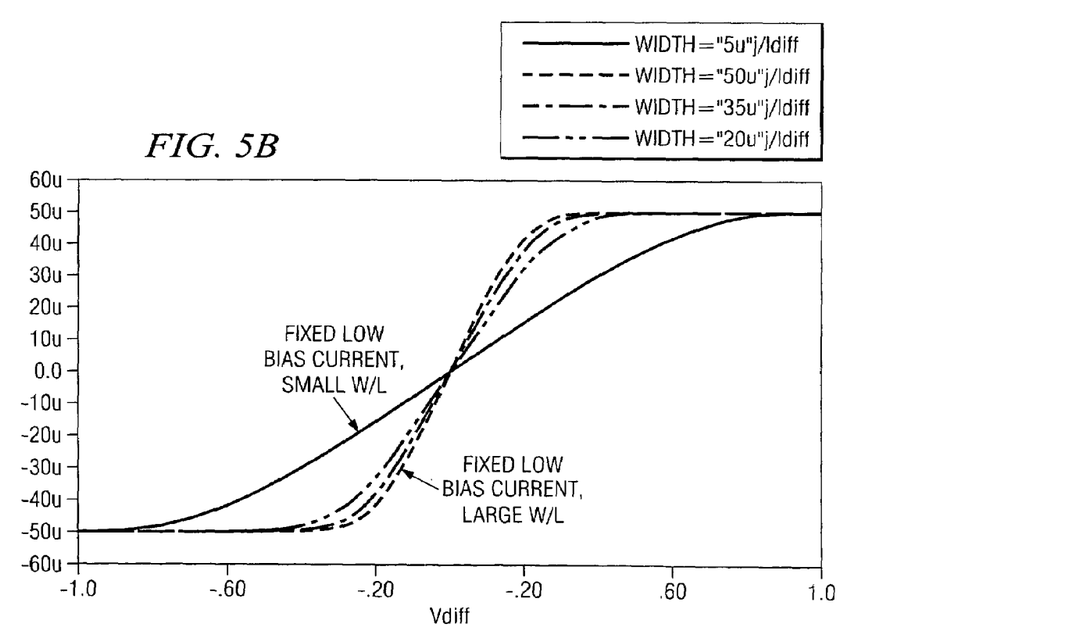
FIG. 5B is a diagram illustrating the current versus input voltage for NFET differential pairs comprising various aspect ratios.

This is in contrast, for example, to Bipolar Junction Transistor (BJT) pairs. The linearity of a BJT differential pair does not scale with device sizing or current. FIGS. 5A and 5B compare the difference between the current versus input voltage for a BJT differential pair versus a NFET differential pair. As can be seen, both the currents and corresponding input voltages are much lower for the NFET differential pair (FIG. 5B) as compared to the BJT differential pair (FIG. 5A). Moreover, as illustrated in FIG. 5B, reducing the aspect ratio (W/L) of the NFET devices in the NFET differential pair can result in improved linearity.

As mentioned, similar linearity improvement cannot be achieved by varying the aspect ratio of BJT devices; however, each transistor in a BJT differential pair can be degenerated with an impedance in order to improve linearity. Such improvement is illustrated in FIG. 5A; however, it can also be seen in FIG. 5A that degeneration requires a higher current to make the voltage drop across the degeneration impedance several times larger than the thermal voltage of the BJT devices. Thus, as explained above, improved linearity can be achieved with BJT pairs through degeneration at the cost of much higher current, or power, and reduced headroom.

As mentioned, reducing the aspect ratio of MOSFET devices increases the over drive voltage and leads to improved linearity. But a MOSFET differential pair with a large overdrive voltage requires significant headroom for DC biasing. Therefore, the over drive voltage of MOSFET devices in the conventional Gilbert cell mixer is limited by the supply voltage headroom. This effectively limits the linearity improvement achievable by scaling the MOSFET over drive voltage via lower current or reduced aspect ratio (W/L). The folded technique described above, however, allows for relaxed headroom constraints, which can thus allow the use of a MOSFET differential pair with a larger overdrive voltage.

Accordingly, the design illustrated in FIG. 3 can provide very high linearity performance together with extremely low current suitable for highly integrated transceivers. The current required with the topology illustrated in FIG. 3 is potentially less than half of that required by conventional mixer designs. The topology of mixer 300 in FIG. 3 also works well with low supply voltages, and therefore can be implemented in advanced sub-micron CMOS processes. Mixer 300 also has a wide input common mode range, which relaxes the interface constraints and DC biasing on the driving amplifier stage and allows the mixer to handle larger input signal swings.

Figure 6:
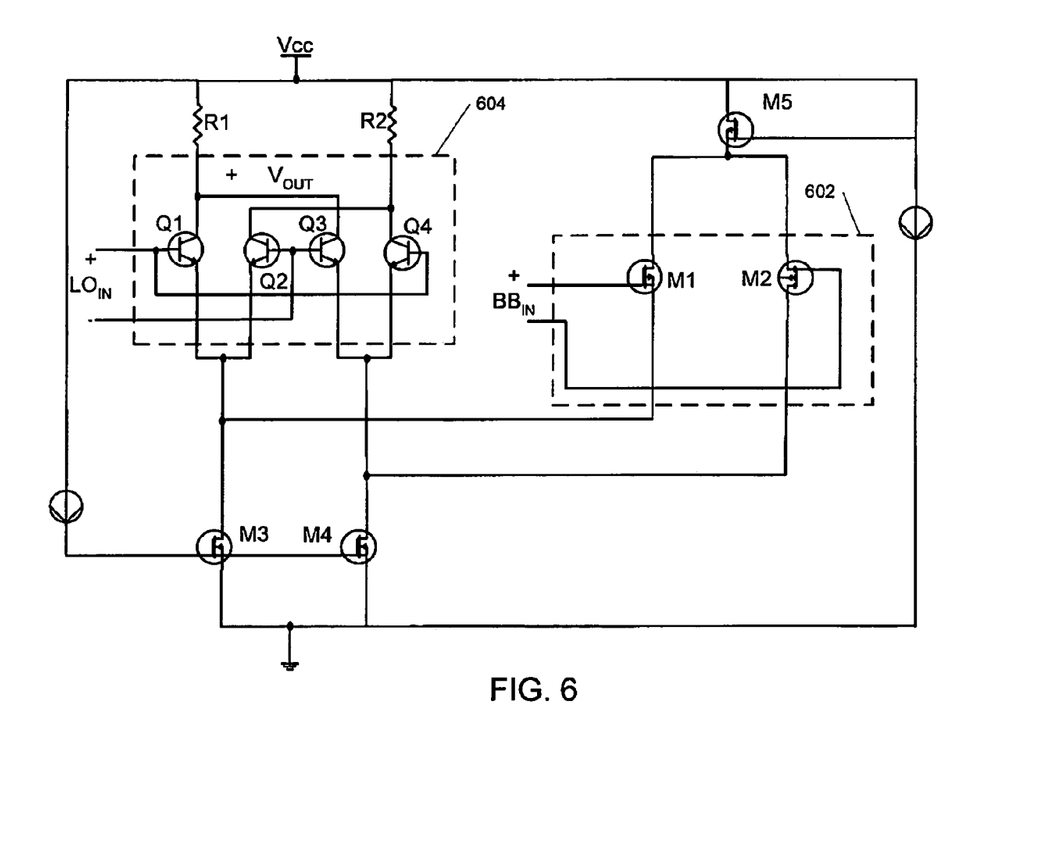
FIG. 6 is a schematic illustrating one implementation of the mixer of FIG. 3.

FIG. 6 is a schematic illustrating a specific implementation of the topology of mixer 300 in FIG. 3. The topology consists of two MOSFETs M1 and M2 as a folded input transconductor 604, four NPN devices Q1, Q2, Q3, and Q4 as an LO switching pair 602, three current sources M3, M4, and M5, and two load resistors R1 and R2. Current sources M3 and M4 bias NPN devices Q1, Q2, Q3, and Q4 and current source M5 biases transistors M1 and M2. Further, as compared to conventional mixer 200 in FIG. 2, transistors M1 and M2 are now PFET devices.

Figure 7:
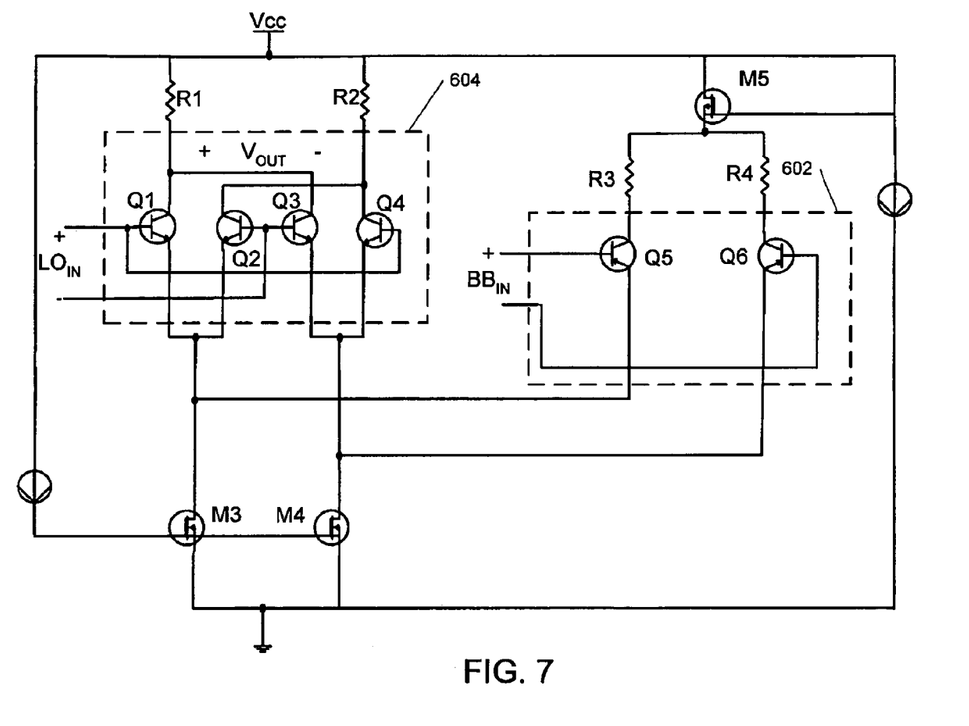
FIG. 7 is a schematic illustrating another implementation of the mixer of FIG. 3.
Figure 8:
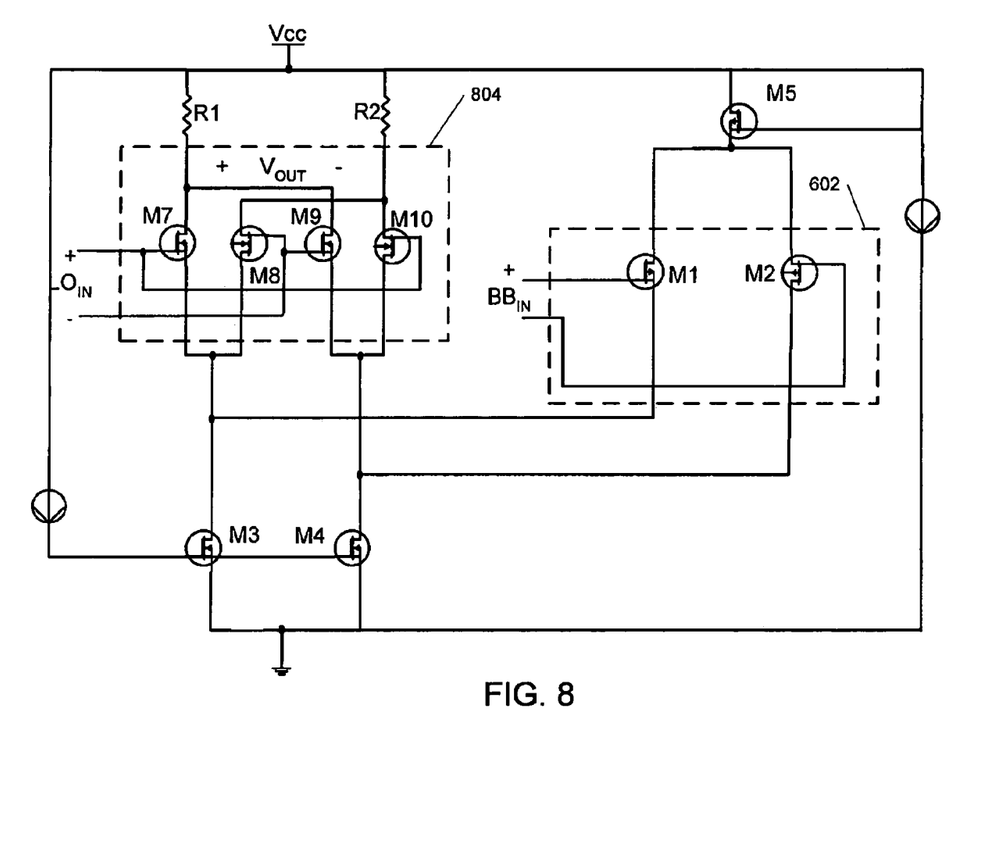
FIG. 8 is a schematic illustrating still another implementation of the mixer of FIG. 3.

Variations on the implementation of FIG. 6 can include degenerated BJT transistors Q5 and Q6 in place of PFET devices M1 and M2 as illustrated in FIG. 7. As can be seen, the topology of FIG. 7 includes degeneration resistors R3 and R4, which can help provide increased linearity of PNP devices Q5 and Q6, although at a higher current. In another variation, BJT devise Q1-Q4 can be replaced with NFET devices M7-M10 to form a MOSFET LO switching pair 804 as illustrated in the example of FIG. 8. In another embodiment, the LO switching pair includes PFET devices M7-M10 and the transconductor can include degenerated NPN BJT trans-conductor devices Q1 and Q2; however, if the switching pair includes P-type devices, and the transconductor includes N-Type devices, then further modifications to the circuit of FIG. 6 are needed as described below.

The specific implementation, or variation thereof, of the folded mixer topology described herein will depend on the requirements of the specific application. For example, if a slightly higher current is acceptable, then degenerating BJT transistors Q5 and Q6 as illustrated in FIG. 7 can be preferable. Further, will the embodiments illustrated use N-type devices, BJT or MOSFET, for the LO switching pair and P-type devices for the transconductor, other embodiments can use P-type devices for the LO switching pair and N-type devices for the transconductor. Again, if the transconductor used PNP devices, then degeneration can be used to increase linearity, at the cost of current consumption, if preferable.

Further, current sources I1 and I2 will need to supply current from the appropriate rail, i.e., Vcc or ground, depending on the type of devices being used for the respective stages. For example, in an embodiment in which P-type device are used for the LO switching pair and N-type device are used for the transconductor, and in which current source I1 supplies current from the positive rail, while current source I2 supplies current form the negative rail.

The mixer designs described herein can be implemented in a variety of application and can be implemented on either the receive or transmit side to achieve up and/or down conversion as required. The suitability of the architectures described herein, and the specific implementation, will depend on the specific application. In general, while certain embodiments and/or implementations of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A mixer, comprising:
   an LO switching pair comprising devices of a certain type;
   a folded transconductor comprising a differential pair, the differential pair including devices of a type that is opposite the type of devices included in the LO switching pair;
   a supply voltage rail;
   a ground rail;
   a current source configured to supply current to both the LO switching pair and the folded transconductor, the current source coupled with one of the supply voltage rail and the ground rail; and
   a second current source configured to supply a low current to the folded transconductor, the second current source coupled to the other of the supply voltage rail and the ground rail.

2. The mixer of claim 1, wherein the LO switching pair comprises N-type device and the folded transconductor comprise P-type devices.

3. The mixer of claim 2, wherein the LO switching pair comprises NPN devices.

4. The mixer of claim 2, wherein the LO switching pair comprises NFET devices.

5. The mixer of claim 2, wherein the folded transconductor comprises PNP devices.

6. The mixer of claim 2, wherein the folded transconductor comprises degenerated PNP devices.

7. The mixer of claim 2, wherein the folded transconductor comprises PFET devices.

8. The mixer of claim 1, wherein the LO switching pair comprises P-type device and the folded transconductor comprise N-type devices.

9. The mixer of claim 8, wherein the LO switching pair comprises PNP devices.

10. The mixer of claim 8, wherein the LO switching pair comprises PFET devices.

11. The mixer of claim 8, wherein the folded transconductor comprises NPN devices.

12. The mixer of claim 8, wherein the folded transconductor comprises degenerated NPN devices.

13. The mixer of claim 8, wherein the folded transconductor comprises NFET devices.

14. The mixer of claim 1, wherein the mixer is an upconversion mixer.

15. The mixer of claim 1, wherein the mixer is an down conversion mixer.

16. The mixer of claim 1, wherein the mixer is included in a transmitter.

17. The mixer of claim 1, wherein the mixer is included in a receiver.

18. A mixer, comprising:
an LO switching pair comprising NPN devices;
a folded transconductor comprising a differential pair, the differential pair including PFET devices;
a supply voltage rail;
a ground rail;
a current source configured to supply current to both the LO switching pair and the folded transconductor, the current source coupled between the LO switching pair and folded transconductor on one end and the ground rail on the other; and
a second current source configured to supply a low current to the folded transconductor, the second current source coupled between the supply voltage rail and the folded transconductor.

19. A communication device, comprising:
a baseband processor; and
a transceiver coupled with the baseband processor, the transceiver comprising a mixer, the mixer including:
an LO switching pair comprising devices of a certain type;
a folded transconductor comprising a differential pair, the differential pair including devices of a type that is opposite the type of devices included in the LO switching pair;
a supply voltage rail;
a ground rail;
a current source configured to supply current to both the LO switching pair and the folded transconductor, the current source coupled with one of the supply voltage rail and the ground rail; and
a second current source configured to supply a low current to the folded transconductor, the second current source coupled to the other of the supply voltage rail and the ground rail.

20. The communication device of claim 19, wherein the LO switching pair comprises N-type device and the folded transconductor comprise P-type devices.

21. The communication device of claim 20, wherein the LO switching pair comprises NPN devices.

22. The communication device of claim 20, wherein the LO switching pair comprises NFET devices.

23. The communication device of claim 20, wherein the folded transconductor comprises PNP devices.

24. The communication device of claim 20, wherein the folded transconductor comprises degenerated PNP devices.

25. The communication device of claim 20, wherein the folded transconductor comprises PFET devices.

26. The communication device of claim 19, wherein the LO switching pair comprises P-type device and the folded transconductor comprise N-type devices.

27. The communication device of claim 26, wherein the LO switching pair comprises PNP devices.

28. The communication device of claim 26, wherein the LO switching pair comprises PFET devices.

29. The communication device of claim 26, wherein the folded transconductor comprises NPN devices.

30. The communication device of claim 26, wherein the folded transconductor comprises degenerated NPN devices.

31. The communication device of claim 26, wherein the folded transconductor comprises NFET devices.

32. The communication device of claim 19, wherein the mixer is an upconversion mixer.

33. The communication device of claim 19, wherein the mixer is a down conversion mixer.

34. The communication device of claim 19, wherein the mixer is included in a transmitter.

35. A mixer, comprising:
an LO switching means for translating the frequency of a signal from one frequency to another, the LO switching means comprising devices of a certain type;
a folded transconductor means for converting a differential voltage signal into a current signal and supplying the current signal to the LO switching means, the folded transconductor means comprising a differential pair, the differential pair including devices of a type that is opposite the type of devices included in the LO switching pair;
a means for providing a supply voltage;
a means for providing a ground potential;
a current source means for supplying current to both the LO switching means and the folded transconductor means, the current source means coupled with one of the means for providing a supply voltage and the means for providing a ground potential; and
a second current source means for supplying a low current to the folded transconductor means, the second current source means coupled to the other of the means for providing a supply voltage and the means for providing a ground potential.

36. The mixer of claim 35, wherein the LO switching means comprises N-type device and the folded transconductor means comprise P-type devices.

37. The mixer of claim 36, wherein the LO switching means comprises NPN devices.

38. The mixer of claim 36, wherein the LO switching means comprises NFET devices.

39. The mixer of claim 36, wherein the folded transconductor means comprises PNP devices.

40. The mixer of claim 36, wherein the folded transconductor means comprises degenerated PNP devices.

41. The mixer of claim 36, wherein the folded transconductor means comprises PFET devices.

42. The mixer of claim 35, wherein the LO switching means comprises P-type device and the folded transconductor means comprise N-type devices.

43. The mixer of claim 42, wherein the LO switching means comprises PNP devices.

44. The mixer of claim 42, wherein the LO switching means comprises PFET devices.

45. The mixer of claim 42, wherein the folded transconductor means comprises NPN devices.

46. The mixer of claim 42, wherein the folded transconductor means comprises degenerated NPN devices.

47. The mixer of claim 42, wherein the folded transconductor means comprises NFET devices.

48. The mixer of claim 35, wherein the mixer is an upconversion mixer.

49. The mixer of claim 35, wherein the mixer is an down conversion mixer.

50. The mixer of claim 35, wherein the mixer is included in a transmitter.

51. The mixer of claim 35, wherein the mixer is included in a receiver.

52. A method for translating the frequency of a signal from one frequency to another, the method comprising:
   converting a differential voltage signal into a current signal using a folded transconductor comprising a differential pair, the differential pair including devices of a certain type;
   translating the frequency of the current signal from one frequency to another using a LO switching pair comprising devices of a certain type that is opposite the type of devices included in the folded transconductor;
   providing a supply voltage;
   providing a ground potential;
   supplying current to both the LO switching pair and the folded transconductor using a current source means coupled with one of a means for providing the supply voltage and a means for providing the ground potential; and
   supplying a low current to the folded transconductor using a second current source means coupled to the other of the means for providing a supply voltage and the means for providing a ground potential.

53. The method of claim 52, wherein the LO switching pair comprises N-type device and the folded transconductor comprise P-type devices.

54. The method of claim 53, wherein the LO switching pair comprises NPN devices.

55. The method of claim 53, wherein the LO switching pair comprises NFET devices.

56. The method of claim 53, wherein the folded transconductor comprises PNP devices.

57. The method of claim 53, wherein the folded transconductor comprises degenerated PNP devices.

58. The method of claim 53, wherein the folded transconductor comprises PFET devices.

59. The method of claim 52, wherein the LO switching pair comprises P-type device and the folded transconductor comprise N-type devices.

60. The method of claim 59, wherein the LO switching pair comprises PNP devices.

61. The method of claim 59, wherein the LO switching pair comprises PFET devices.

62. The method of claim 59, wherein the folded transconductor comprises NPN devices.

63. The method of claim 59, wherein the folded transconductor comprises degenerated NPN devices.

64. The method of claim 59, wherein the folded transconductor comprises NFET devices.

65. The method of claim 52, wherein translating the frequency of a signal from one frequency to another comprising upconverting the frequency from a low frequency to a higher frequency.

66. The method of claim 52, wherein translating the frequency of a signal from one frequency to another comprising down converting the frequency from a high frequency to a lower frequency.

* * * * *